United States Patent
Kale et al.

(10) Patent No.: US 10,629,247 B2
(45) Date of Patent: Apr. 21, 2020

(54) READ THRESHOLD ADJUSTMENT USING REFERENCE DATA

(71) Applicant: Western Digital Technologies, Inc., San Jose, CA (US)

(72) Inventors: Salil Kale, Indore (IN); Shreejith Kv, Kasaragod (IN); Aneesh Puthoor, Bangalore (IN); Gopu S, Trivandrum (IN); Narayan K, Bangalore (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 76 days.

(21) Appl. No.: 15/851,537

(22) Filed: Dec. 21, 2017

(65) Prior Publication Data

US 2019/0198069 A1    Jun. 27, 2019

(51) Int. Cl.
| | |
|---|---|
| *G11C 29/00* | (2006.01) |
| *G11C 7/22* | (2006.01) |
| *G11C 7/14* | (2006.01) |
| *G11C 29/52* | (2006.01) |
| *G06F 11/10* | (2006.01) |
| *G11C 29/10* | (2006.01) |
| *G11C 13/00* | (2006.01) |
| *G11C 29/44* | (2006.01) |
| *G11C 29/36* | (2006.01) |
| *G11C 29/42* | (2006.01) |

(52) U.S. Cl.
CPC ............ *G11C 7/22* (2013.01); *G06F 11/1068* (2013.01); *G11C 7/14* (2013.01); *G11C 13/004* (2013.01); *G11C 29/10* (2013.01); *G11C 29/36* (2013.01); *G11C 29/42* (2013.01); *G11C 29/44* (2013.01); *G11C 29/52* (2013.01); *G11C 2029/3602* (2013.01); *G11C 2029/4402* (2013.01)

(58) Field of Classification Search
CPC .. G11C 29/52; G11C 7/22; G11C 7/14; G06F 11/1068
See application file for complete search history.

(56) References Cited

U.S. PATENT DOCUMENTS

| | | | |
|---|---|---|---|
| 8,031,529 B2 | 10/2011 | Sarin | |
| 8,645,773 B2 | 2/2014 | Goss et al. | |
| 8,665,645 B2 | 3/2014 | Avraham et al. | |
| 2012/0188820 A1* | 7/2012 | Neumeyer | G11C 7/14 365/185.2 |
| 2012/0271982 A1* | 10/2012 | Callaghan | G11C 16/10 711/103 |
| 2013/0194865 A1 | 8/2013 | Bandic et al. | |

\* cited by examiner

*Primary Examiner* — Samir W Rizk
(74) *Attorney, Agent, or Firm* — Kunzler Bean & Adamson, PC

(57) ABSTRACT

Apparatuses, systems, and methods are disclosed for read threshold adjustment using reference data for non-volatile memory. An apparatus may include an array of non-volatile memory cells and a controller. A controller may be configured to write a predetermined reference data pattern to a region of an array. A controller may be configured to read reference data from a region. A controller may be configured to set one or more read thresholds based on identifying differences between reference data and a predetermined reference data pattern.

17 Claims, 9 Drawing Sheets

US 10,629,247 B2

READ THRESHOLD ADJUSTMENT USING REFERENCE DATA

TECHNICAL FIELD

The present disclosure, in various embodiments, relates to non-volatile memory and more particularly relates to read threshold adjustment using reference data.

BACKGROUND

Various types of memory devices store data in two-dimensional or three-dimensional arrays of memory cells. To store data, a controllable physical characteristic of a cell may be changed to represent a particular state. For example, a cell may be capable of storing data based on altering a stored charge within a range of charges, altering a resistance within a range of resistances, or the like. Threshold values for the controllable physical characteristic may divide the range of possible values into different states, where each state may be associated with a data value. However, the controllable physical characteristic for the cells may drift past threshold values, causing errors. For example, drift may occur over time, causing data retention errors, or may occur due to disturbances from other memory operations. Drift may also occur due to temperature or other factors.

SUMMARY

Apparatuses are presented for read threshold adjustment using reference data for non-volatile memory. An apparatus, in one embodiment, includes an array of non-volatile memory cells and a controller. A controller, in one embodiment, is configured to write a predetermined reference data pattern to a region of an array. In a certain embodiment, a controller is configured to read reference data from a region. In a further embodiment, a controller is configured to set one or more read thresholds based on identifying differences between reference data and a predetermined reference data pattern.

Methods are presented for read threshold adjustment using reference data for non-volatile memory. In one embodiment, a method includes acquiring a current state of a test pattern in an array of non-volatile memory. In a certain embodiment, a method includes comparing a current state to a previous state of a test pattern. In at least one embodiment, a method includes identifying differences between a current state and a previous state for a test pattern. In a further embodiment, a method includes adjusting read thresholds for a portion of an array of non-volatile memory associated with a test pattern based on identified differences.

An apparatus, in another embodiment, includes means for reading at least one cell of a non-volatile memory array. In a certain embodiment, an apparatus includes means for identifying errors associated with at least an erase state and a highest state of a plurality of data states. In a further embodiment, an apparatus includes means for adjusting read thresholds based on identified errors.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered limiting of the scope of the disclosure, the disclosure is described and explained with additional specificity and detail through the use of the accompanying drawings, in which.

DETAILED DESCRIPTION

Figure 1:
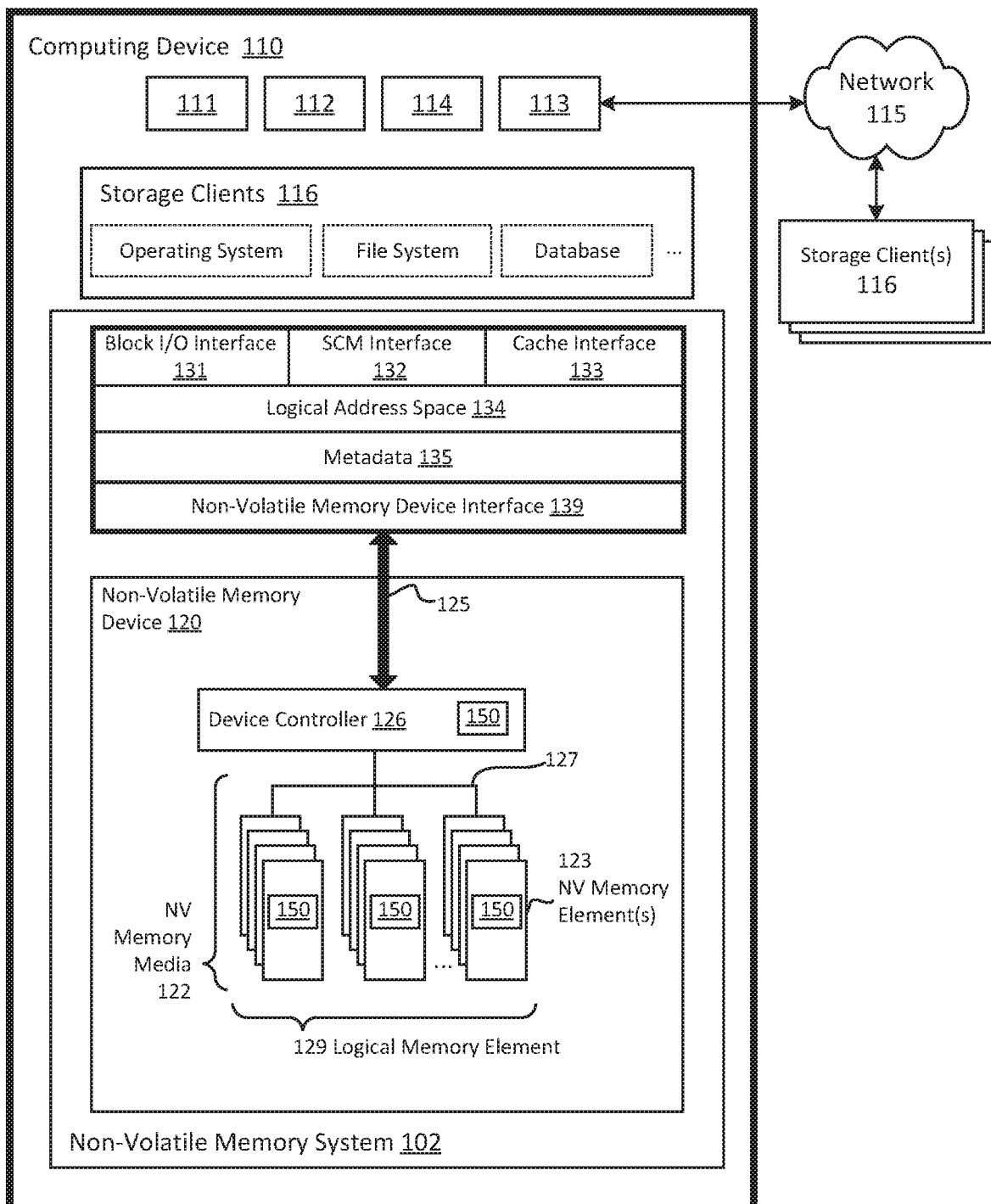
FIG. 1 is a schematic block diagram illustrating one embodiment of a system comprising non-volatile memory elements.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising one or more read threshold adjustment components 150 for a non-volatile memory device 120. Read threshold adjustment components 150 may be part of one or more non-volatile memory elements 123, a device controller 126 external to the non-volatile memory elements 123, a device driver, or the like. Read threshold adjustment components 150 may be part of a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein.

The non-volatile memory system 102, in the depicted embodiment, includes one or more read threshold adjustment components 150. A read threshold adjustment component 150, in one embodiment, may be configured to write a predetermined reference data pattern to a region of an array of non-volatile memory; read reference data from the region; and set one or more read thresholds based on comparing the reference data to the predetermined reference data pattern. By setting the read thresholds based on the comparison of the reference data, a read threshold adjustment component 150 may adjust read thresholds to compensate for movement of the charges stored in memory cells. The read threshold adjustment component 150, by predicting and adjusting the read thresholds, may reduce the need for other more time-consuming techniques to ascertain and correct errors that may arise in the array. Read threshold adjustment components 150 are described in greater detail below with regard to FIGS. 2-8.

In one embodiment, a read threshold adjustment component 150 may include logic hardware of one or more non-volatile memory devices 120, such as a device controller 126, a non-volatile memory element 123, other programmable logic, firmware for a non-volatile memory element 123, microcode for execution by a non-volatile memory element 123, or the like. In another embodiment, a read threshold adjustment component 150 may include executable software code, stored on a computer readable storage medium for execution by logic hardware of a non-volatile memory element 123. In a further embodiment, a read threshold adjustment component 150 may include a combination of both executable software code and logic hardware.

In one embodiment, the non-volatile memory device 120 is configured to receive storage requests from a device driver or other executable application via buses 125, 127, a device controller 126, or the like. The non-volatile memory device 120 may be further configured to transfer data to/from a device driver and/or storage clients 116 via the bus 125. Accordingly, the non-volatile memory device 120, in some embodiments, may comprise and/or be in communication with one or more direct memory access (DMA) modules, remote DMA modules, bus controllers, bridges, buffers, and so on to facilitate the transfer of storage requests and associated data. In another embodiment, the non-volatile memory device 120 may receive storage requests as an API call from a storage client 116, as an IO-CTL command, or the like.

According to various embodiments, a device controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or communication interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective device controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: resistive random access memory (ReRAM), Memristor memory, phase-change memory (PCM, PCME, PRAM, PCRAIVI, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A device controller 126, external to the one or more non-volatile memory elements 123, may be configured to manage data operations on the non-volatile memory media 122, and may comprise one or more processors, programmable processors (e.g., FPGAs), ASICs, microcontrollers, or the like. In some embodiments, the device controller 126 is configured to store data on and/or read data from the non-volatile memory media 122, to transfer data to/from the non-volatile memory device 120, and so on.

The device controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the device controller 126 over a bus 125, as described above.

Figure 2:
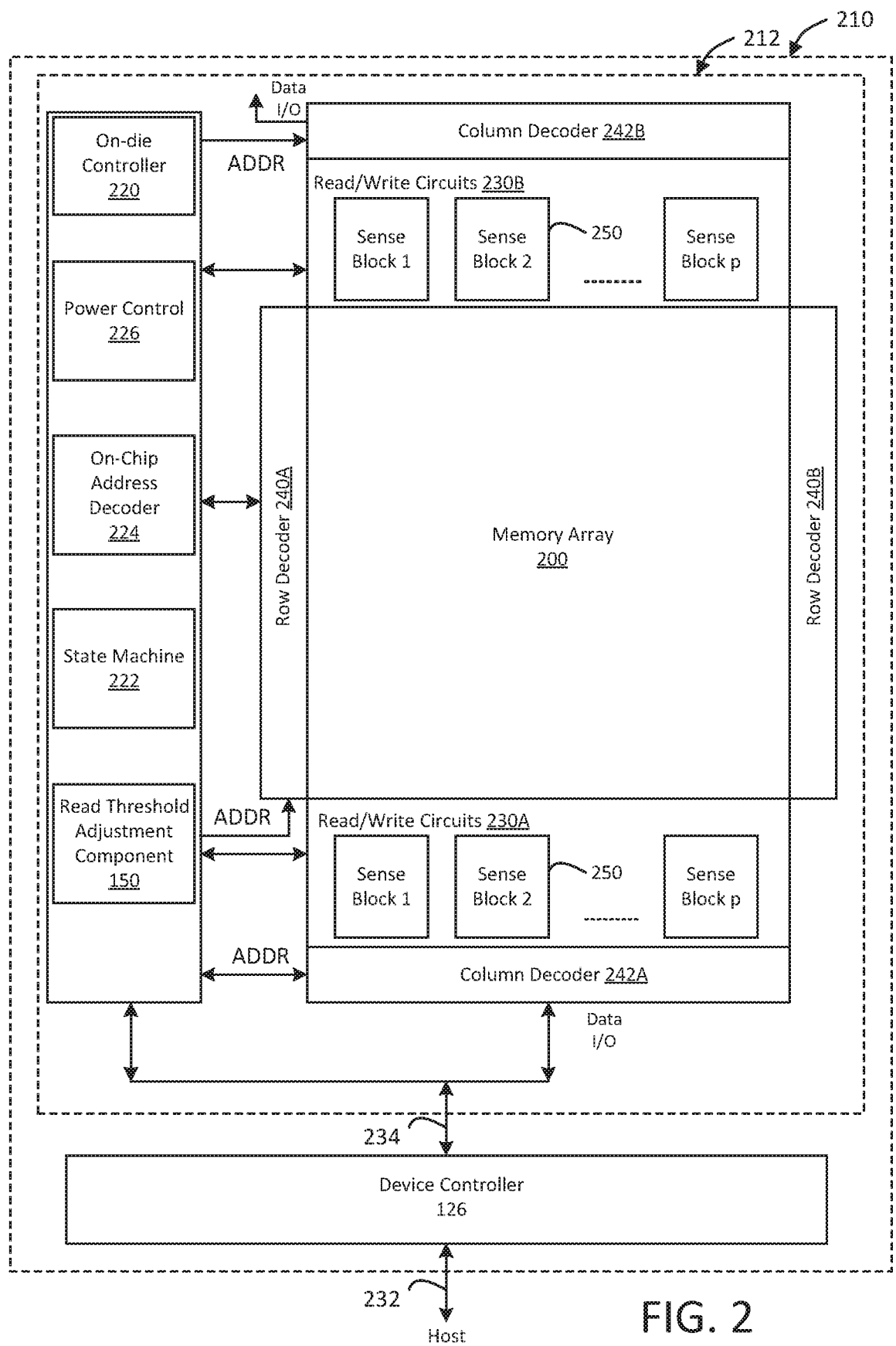
FIG. 2 is a schematic block diagram illustrating another embodiment of a system comprising non-volatile memory elements.

FIG. 2 illustrates an embodiment of a non-volatile storage device 210 that may include one or more memory die or chips 212. A memory die or chip 212 may be a non-volatile memory element 123 as described above with regard to FIG. 1. The non-volatile storage device 210 may be substantially similar to the non-volatile memory device 120 described with reference to FIG. 1. Memory die 212, in some embodiments, includes an array 200 (two-dimensional or three-dimensional) of memory cells, an on-die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel. In the depicted embodiment, peripheral circuits such as row decoders 240A/240B, column decoders 242A/242B, and read/write circuits 230A/230B are disposed at the edges of the memory array. In another embodiment, however, peripheral circuitry may be disposed above, below, and/or at the sides of a three-dimensional memory array 200.

The memory array 200, in various embodiments, is addressable by word lines via row decoders 240A/240B and by bit lines via column decoders 242A/242B. In some embodiments, a device controller 126 external to the memory die 212 is included in the same memory device 210 (e.g., a removable storage card or package) as the one or more memory die 212. Commands and data are transferred between the host and the device controller 126 via lines 232 and between the device controller 126 and the one or more memory die 212 via lines 234. One implementation can include multiple chips 212.

On-die controller 220, in one embodiment, cooperates with the read/write circuits 230A/230B to perform memory operations on the memory array 200. The on-die controller 220, in certain embodiments, includes a state machine 222, an on-chip address decoder 224, a power control circuit 226, and a read threshold adjustment component 150, which may be substantially as described above with regard to FIG. 1. In various embodiments, a read threshold adjustment component 150 may include or be embodied by an on-die controller 220, a state machine 222, a device controller 126, and/or a device driver.

The state machine 222, in one embodiment, provides chip-level control of memory operations. The on-chip address decoder 224 provides an address interface to convert between the address that is used by the host or a device controller 126 to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In one embodiment, one or any combination of on-die controller 220, power control circuit 226, on-chip address decoder 224, state machine 222, read threshold adjustment component 150, decoder circuit 242A, decoder circuit 242B, decoder circuit 240A, decoder circuit 240B, read/write circuits 230A, read/write circuits 230B, and/or device controller 126 can be referred to as one or more managing circuits.

Figure 3:
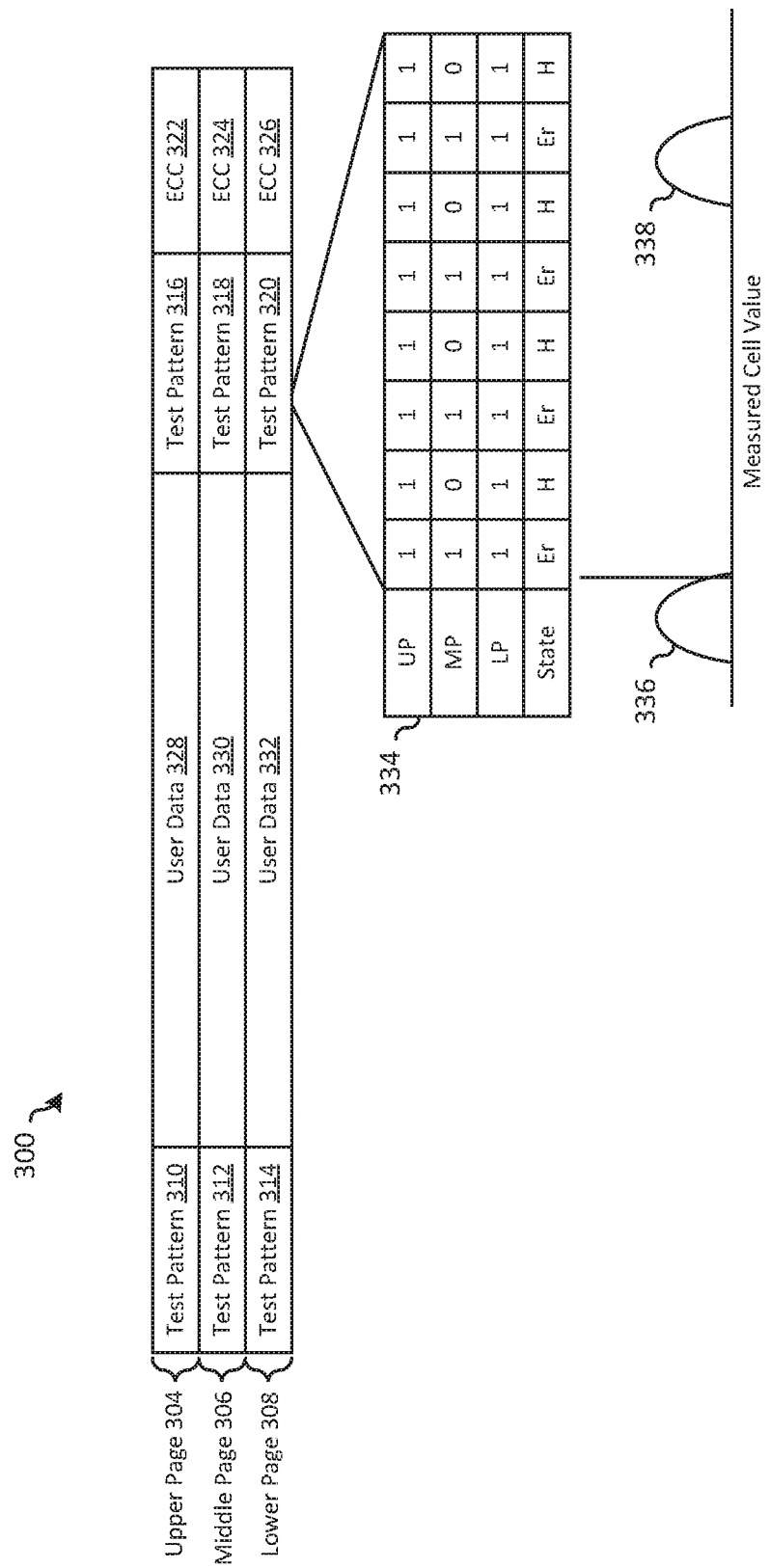
FIG. 3 is a block diagram and graph illustrating an embodiment for a possible reference data pattern stored in an array of non-volatile memory cells.

FIG. 3 shows a block diagram and a graph that illustrate a region 300 of memory that stores a test pattern according to at least one embodiment described herein. A test pattern, in certain embodiments, may comprise a reference data pattern, reference pattern, test data pattern, or the like. The region 300 may be a portion of the memory array 200 in FIG. 2. The region 300 may be a group of cells in a word line, a word line, multiple word lines, multiple arrays 200, and the like. As illustrated, the cells of memory in the region 300 may be multi-level cells (MLC), where each cell may store more than a single bit of data (e.g., two bits of data per cell). In other embodiments, the cells of memory in the region 300 may comprise single-level cells (SLC) that store one bit of data per cell, triple-level cells (TLC) that store three bits of data per cell, quad-level cells (QLC) that store four bits of data per cell, cells that store more than four bits of data per cell, or other type of cell capable of storing a number of bits therein. Also, the different cells in the region 300 may store different numbers of bits. For example, some cells in the region 300 may be MLCs and other cells in the region 300 may be SLCs (e.g., a combination of one or more SLC erase blocks of memory cells, one or more MLC erase blocks of memory cells, one or more TLC erase blocks of memory cells, one or more QLC erase blocks of memory cells, and/or another combination of different types of memory cells).

In certain embodiments, the test pattern may be proximate to user data. By being proximate to the user data, changes to user data that result from read disturbs, data retention, and other processes may be similar to changes that occur in the test pattern from the read disturbs, data retention, and the other processes. For example, in at least one embodiment, when cells in the region 300 are programmed, data may be programmed through multiple pages. For example, the data may be programmed to the region 300 of memory by successively programming a lower page 308 of data, a middle page 306 of data, and a upper page 304 of data. As shown, in the region 300, with each programmed page, a portion of the page may be programmed to store an associated test pattern. For instance, the lower page 308 may store both a test pattern 314 and a test pattern 320, the middle page 306 may store both a test pattern 312 and test pattern 318, and the upper page 304 may store both a test pattern 310 and a test pattern 316. As depicted, the different test patterns associated with a page may be located on opposite ends of the user data, where the user data may include information stored in the memory array 220 other than data used to correct errors in the user data. For example, the test pattern 310 precedes the user data 328 and the test pattern 316 succeeds the user data 328 in the upper page 304. The user data 330 and the user data 332 and the respective test patterns 312, 314, 318, and 320 are similarly arranged as the user data 328 and the associated test patterns 310 and 316. In an alternative embodiment, a page of data may be associated with a single region containing a test pattern. Further, a region containing a test pattern may be associated with multiple pages of data.

In a further embodiment, a page of data may have an associated error correction code. For example, upper page 304 may include error correction information 322, middle page 306 may include error correction information 324, and lower page 308 may include error correction information 326. The error correction information 322-326 may be used by a controller, such as the on-die controller 220 in FIG. 2, to execute error correcting codes that use the error correction information to correct errors that are found in the user data and in the test pattern. For example, the error correction information may include parity bits that may be used to indicate whether errors exist in the data stored in the page and to correct certain errors when possible.

In certain embodiments, the test pattern may contain bits that are stored at the highest energy state and at the erase state in order to identify adjustments that may be made to read thresholds for the various data states stored in the region 300, where a read threshold may be a value that is used to ascertain the data state for a particular cell. A portion 334 of a test pattern is shown, where the data stored in the cells alternates between an erase state, shown in the graph 350 as distribution 336, and a highest state, shown in the graph 350 as distribution 338. As shown, the graph 350 illustrates different distributions of measured cell values for the cells in the region 300. In at least one embodiment, quantifiable physical characteristics of a cell may be measured to identify different data states for a cell. For example, resistance, threshold voltages, current, among other physical characteristics may indicate that a cell in the region 300 is associated with a particular data state. In certain embodiments, the erase state and the highest state indicate different data states at opposite ends of a range of a measurable physical characteristic, where the range is separable into different data states. As illustrated in the graph 350, cells associated with the test patterns may either be in the erase state or the highest state. By having the cells associated with the test pattern at either the highest state or the erase state, a controller may be able to identify changes to the distributions of the cells in the test pattern and adjust read thresholds for the erase state and highest state and then interpolate changes to the read thresholds of the states that are between the erase state and the highest state as described below with relation to FIGS. 4A-4B. As shown in the table associated with portion 334, a test pattern in the upper page and the lower page may be programmed to have the same bit stored in each cell. In contrast, the middle page may be programmed to have an alternating bit stored in each cell. Further, in certain embodiments, as the memory cells age, the length of the test patterns may increase and, commensurately, the size of the user data in the region 300 may decrease to accommodate the increased length of the test patterns.

Figures 4A, 4B:
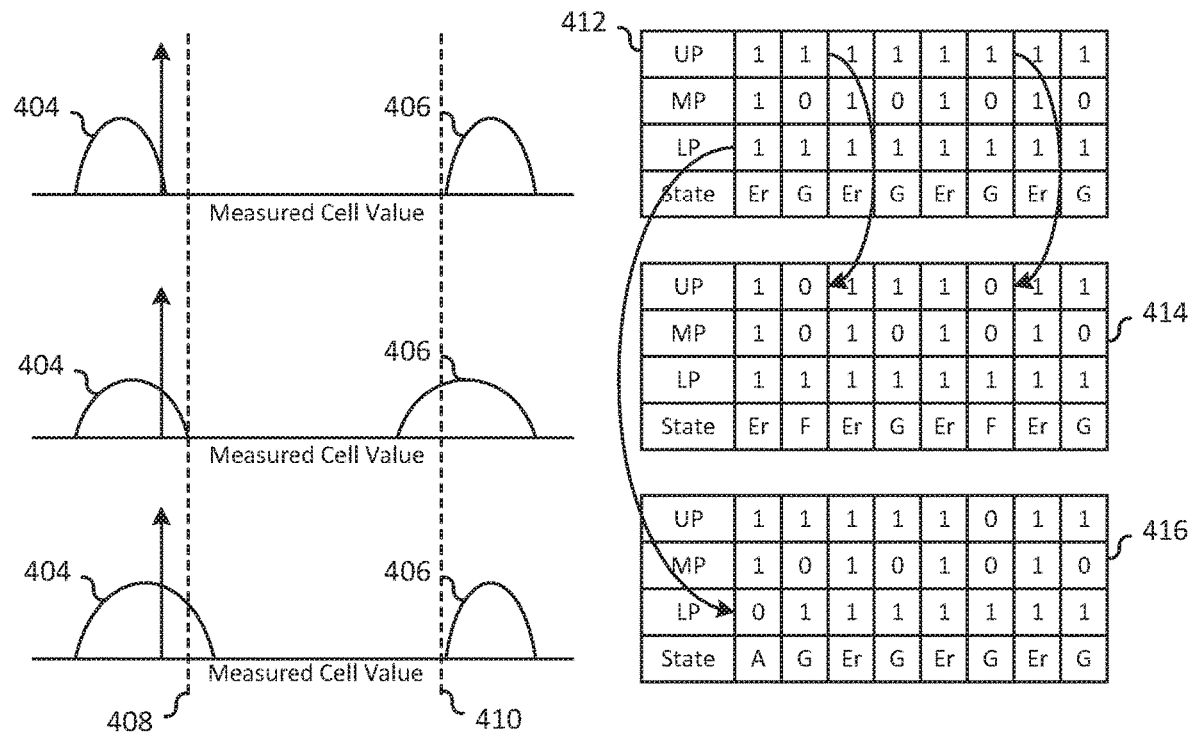
FIG. 4A is a table illustrating an embodiment for encoding bits stored in non-volatile memory cells.
FIG. 4B is a diagram illustrating changes in the reference data pattern in response to data retention time and read disturbs according to certain embodiments.

FIG. 4A is a table 402 illustrating an embodiment of a possible encoding for the different data states in a triple-level cell. While the encoding illustrated in the table 402 may be for a triple-level cell. Cells of memory associated with the region 402 may alternatively be single-level cells (SLC), multi-level cells (MLC), quad-level cells (QLC), or other type of cell capable of storing a number of bits therein. As shown, the different data states are encoded according to a Gray code, where each code differs from adjacent codes by a single bit. For example, the different data states may be represented by the erase state and the letters "A-G," where the "A" state is proximate the erase state and the "G" state is the highest state. In at least one embodiment, the different data states represent a continuum of cell values, where a cell is programmed by changing the physical characteristic of the cell to a value in the continuum of cell values that is associated with a particular data state. For example, the erase state is encoded with the bits "111," the "A" state is encoded with the bits "110" and is proximate to the erase state, the "B" state is encoded with the bits "100" and is proximate to the "A" state, the "C" state is encoded with the bits "000" and is proximate to the "B" state, the "D" state is encoded with the bits "010" and is proximate to the "C" state, the "E" state is encoded with the bits "011" and is proximate to the "D" state, the "F" state is encoded with the bits "001" and is proximate to the "E" state, and the "G" state is encoded with the bits "101" and is proximate to the "F" state. During operation, a cell value associated with the data state is most likely to drift to a cell value in a proximate data state.

For example, FIG. 4B illustrates the effect of different types of drift on the data stored in the test pattern. Initially, the test pattern may be stored as shown in table 412. Table 412 is substantially similar to the table associated with portion 334. As shown in table 412, proximate cells alternate between the highest data state or the erase state. Further, the graph associated with table 412 illustrates a distribution of a measured cell value associated with the erase state and a distribution of a measured cell value associated with the "G" state. Illustrated in the graph are two read thresholds 408 and 410. The read threshold 408 is associated with the erase state. For example, if the read threshold 408 is a voltage threshold, cells that turn on in response to a voltage that is less than or equal to the read threshold 408 will be determined to be in the erase state. In a similar manner, the read threshold 410 may be associated with the highest state. Any cells that don't turn on in response to a voltage less than or equal to the read threshold 410 may be determined to be in the highest state. As illustrated in the graph associated with table 412, the distribution of cell values 404 associated with the lowest or erase state is almost entirely below the read threshold 408. Likewise, the distribution of cell values 406 associated with the highest state is almost entirely above the read threshold 410.

Table 414 illustrates a possible change that may occur over time with respect to retaining the data in memory when the measured cell value is charge. Memory cells may have quantifiable physical characteristics that can be used to represent different data states. As time passes, the physical characteristics of the cells may drift such that the original mapping of the physical characteristics to data states may no longer be accurate. For example, the cells associated with the higher energy states may lose their charge, where the lost charge may be absorbed by cells in lower data states. The loss of charge from cells configured to be in higher data states may cause the distribution of cell values 404 of charges stored in cells associated with the erase state to increase in range as the cells in the erase state absorb charge from neighboring cells in higher data states. Conversely, the distribution of cell values 406 of cells in the highest data state may widen as the cells lose charge. Accordingly, as the distributions widen, cells that are intended to be associated with a particular data state may drift to values associated with different data states as portions of the distribution extend beyond the read thresholds associated with the particular data state. For example, a portion of the distribution of cell values 404 associated with the erase state may widen such that cells configured to be in the erase state turn on at a voltage above the read threshold 408 (not shown). Also, a portion of the distribution of cell values 406 associated with the highest state may widen such that cells configured to be in the highest state turn on at voltage below the read threshold 410, which is associated with the highest state. As shown, in the table 414, when the distribution of cell values 406 extends below the read threshold 410, the measured cell value of cells configured to be in the highest state may indicate a data state different from the initially programmed data state. Accordingly, the change from the initially programmed state causing the data to be interpreted differently from its initially programmed state may result in at least one bit error.

Bit errors may also arise as illustrated in connection with table 416, which illustrates a possible change that may occur over time in response to multiple read disturbs. Over time, as the data is read from the cells, additional charge may accumulate in the cells associated with the lower data states causing the distribution of cell values 404 to increase in width such that cells associated with the erase state may turn on at a voltage distribution of cell values 404 above the read threshold 408. In a similar manner as described in relation to table 414, when cells represented by the distribution of cell values 404 turn on at a voltage above the read threshold 408, the measured cell value of cells configured to be in the erase state may change from the initially programmed erase state to a higher state. Accordingly, the change from the initially programmed state may cause the data to be interpreted differently from its initially programmed state, resulting in at least one bit error.

With relation to both tables 414 and 416, errors that result in the test pattern changing from its initially programmed state are indicative that errors exist in user data stored in the memory array 200. Further, the bit errors that potentially arise are likely to be bit errors associated with a proximate data state. For example, a bit error in the distribution of cell values 404, associated with the erase state is likely to be associated with the "A" data state. Likewise, a bit error in the distribution of cell values 406, associated with the highest state "G," is likely to be associated with the "F" data state. While possible, it is unlikely that charges stored in cells associated with either distribution of cell values 404 or distribution of cell values 406 will change such that bit errors arise in data states that are not proximate to the erase state or the highest state. While the distribution of cell values 404 may expand above the read threshold 408 into the data state "A," it is less likely that the distribution of cell values 404 will expand above a further read threshold into the data state "B," and even less likely that the distribution of cell values 404 will expand above the read threshold associated with the data state "C." Also, while the distribution of cell values 406 may expand below the read threshold 410 into the data state "F," it is less likely that the distribution of cell values 406 will expand below a further read threshold into the data state "E," and even less likely that the distribution of cell values 406 will expand below the read threshold associated with the data state "D."

In certain embodiments, by initially storing a test pattern that includes the erase state and the highest state, a controller, such as the on-die controller 220 in FIG. 2, may identify the number of errors within the test pattern. Based on the number of errors in the test pattern, the controller may characterize changes to the other data states that are between the erase state and the highest state. In response to the changes, the controller may calculate an offset or offsets for the read thresholds. For example, the controller may identify an offset value in a lookup table that is associated with the number of errors within the test pattern. Alternatively, the controller may calculate an offset value using the number of errors within the test pattern as a variable in an equation defining the offset value. After the offset is calculated, subsequent reads may identify the data states using the previous values for the read threshold that have been shifted by the calculated offset. In one embodiment, the same offset is added to each read threshold. In an alternative embodiment, a separate offset is characterized for the separate read thresholds. Accordingly, as the read thresholds are adjusted for changes to the distributions of the separate data states, the controller may better discern the different data states.

Figure 5:
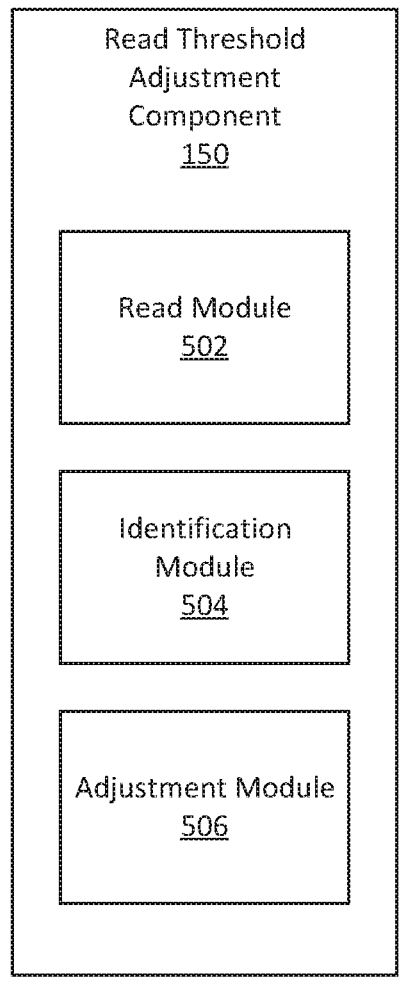
FIG. 5 is a schematic block diagram illustrating one embodiment of a read threshold adjustment component.

FIG. 5 depicts at least one embodiment of a read threshold adjustment component 150. The read threshold adjustment component 150 may be substantially similar to the read threshold adjustment component 150 described above with regard to FIGS. 1-4B. In general, as described above, the read threshold adjustment component 150 is configured to read at least one cell of a non-volatile memory array, identify errors associated with at least one data state for the cells in the non-volatile memory array, and adjust read thresholds based on the identified errors. In the depicted embodiment, the read threshold adjustment component 150 includes a read module 502, an identification module 504, and an adjustment module 506. In various embodiments, a controller, such as an on-die controller 220 for a single non-volatile memory element 123, a device controller 126 for a device comprising one or more non-volatile memory elements 123, a device driver comprising executable code stored on a computer-readable storage medium, or the like, may include the read module 502, the identification module 504, and the adjustment module 506.

The read module 502, in one embodiment, is configured to perform a read operation to acquire data from at least one of the cells of the memory array 200. The read operation, in various embodiments, may include any operation that acquires data from the cells of the memory array 200. In certain embodiments, the read module 502 may read data from the memory array 200 in response to an external read request (e.g., from a client 116), or the read operation may be performed as instructed by the controller. As described above, the read module reads data from the memory by determining whether a quantifiable property of a cell is above or below a read threshold. For example, the read threshold may be a read voltage, when the read voltage is above or below a threshold voltage, the controller may be able to determine a data state for the cell based on the read voltage in relation to the read thresholds.

In certain embodiments, the read module 502 reads data from a particular region in the memory array 200. As described above, a region in the memory array 200 may include a word line, a die, a portion of a word line, multiple die, multiple word lines, and the like. In a region, a cell or group of cells may be configured to store a reference data pattern. As used herein, a reference data pattern and/or a test data pattern is a known pattern of data that may be used to identify changes to physical properties of the cells in the region. Further, the reference and/or test data pattern may be predetermined by a user, manufacturer, or algorithmically by a computation device such as the controller. Over time, changes to the predetermined reference and/or test data pattern may represent changes to the possible data states for the cells in the memory array 200. As described above, a reference and/or test data pattern may be stored in proximate cells within the region, where the proximate cells alternate between measurable physical properties associated with an erase state and a highest state. For example, where the measurable physical property is the charge stored in a memory cell, proximate cells associated with the reference and/or test data pattern alternatingly store a charge associated with an erase state and a highest state. When the predetermined reference and/or test data pattern alternates between an erase state and a highest state, changes to the predetermined reference and/or test data pattern may be used to characterize changes to data states that lie on the continuum between the erase state and the highest state. Further, in certain embodiments, other reference and/or test data patterns that include data states other than the erase state and the highest state may be used to characterize changes to the physical properties of the cells.

In at least one embodiment, the read module 502 maintains a record of the length of the reference data pattern. Alternatively, cells in the region may store data that indicates the length of the reference data pattern associated with the region. When the memory array 200 is initially used, the length of the reference data pattern may be relatively short in comparison to user data stored within the region of the memory array 200. Over time, as potential changes to the physical properties of the cells within the region accumulate, the length of the reference data pattern within the region may increase accordingly. As such, the read module may use a record of the length of the reference data pattern to determine where the reference data pattern starts and where it ends within the region of the memory array 200. In an alternative embodiment, the reference data pattern stored in the region of the memory array 200 may have a fixed length that is constant for all regions of the memory array 200 that are read by the read module 502. In certain embodiments, the length of the reference data pattern may be fixed for certain regions within the memory array 200 and may be variable for other regions within the memory array 200.

The identification module 504, in one embodiment, is configured to identify the errors in a reference data pattern stored in an array of non-volatile memory cells where the reference data pattern has been read by the read module 502. As described above, a known reference data pattern may be stored in a portion of cells in an array of non-volatile memory cells. Upon reading the data in the cells associated with the reference data pattern, the identification module 504 determines if the reference data pattern read from the memory is different from the predetermined test pattern. The identification module 504 identifies the differences between the predetermined reference data pattern and the read reference data pattern as errors. In some embodiments, the identification module 504 may indicate that errors exist in the test pattern, how many errors existed in the test pattern, where the errors exist in the test pattern, a frequency of data retention errors, a frequency of read disturb errors, and the like.

As described above, with respect to FIGS. 3-4B, the test pattern may be located next to user data. For example, the test pattern may be stored in portions of memory both before and after user data. In at least one embodiment, the memory cells storing the memory may be alternatingly set to both the highest data state and the lowest data state. For example, in a word line, the first cell may be in the erase state, the second cell may be in the highest state, the third cell may then be in the erase state, and so forth. The read module 502 reads the cells associated with the test pattern and the identification module 504 identifies the cells that are in data states different from the original test pattern.

The adjustment module 506, in one embodiment, is configured to adjust the read thresholds for the cells in the memory array 200 based on the errors identified by the identification module 504. As described above, the identification module 504 may identify errors in the reference data pattern. Based on the number of errors identified in the reference data pattern the adjustment module 506 may adjust the read thresholds used to discern the data states for the cells in the memory array 200. In certain embodiments, the adjustment module 506 may calculate an offset for the read thresholds. For example, the adjustment module 506 may include a lookup table that stores offset values associated with the number of errors identified in a reference data pattern. Alternatively, the adjustment module 506 may calculate an offset using a using an equation where the offset is dependent on the number of errors identified in the reference data pattern. In certain embodiments, the adjustment module 506 may further calculate the offset based on the character of the errors identified in the reference data pattern. For example, errors identified in cells associated with the erase state may be characterized as read disturb errors and errors identified in cells associated with the highest state may be characterized as data retention errors. Accordingly, the adjustment module 506 may calculate the offset for the separate read thresholds using the number of read disturb errors and data retention errors identified in the data stored in the reference data pattern. For example, if a majority of errors are read disturb errors, then the calculated offset may be larger for data states more likely to be affected by read disturb errors. Conversely, if the majority of errors are data retention errors, then the calculated offset may be larger for data states more likely to be affected by data retention errors.

In a further embodiment, the offset may be further calculated based on the departure from the predetermined reference data pattern. For example, the identification module 504 may calculate the magnitude of the departure from the predetermined reference data pattern. For instance, a cell associated with the erase state may drift such that the cell becomes associated with the "A" state when measured. Also, the different cells associated with the erase state may drift such that the cells become associated with the "B" state. The adjustment module 506 may calculate the magnitude of the departure from the expected data state and use the information to calculate the offset. In certain embodiments, the adjustment module 506 may calculate a single offset for the multiple read thresholds. Alternatively, the adjustment module 506 may calculate a separate offset for each or a subset of the multiple read thresholds. In at least one embodiment, after the adjustment module 506 calculates an offset for the data states represented in the predetermined reference data pattern, the adjustment module 506 uses interpolation or extrapolation to calculate offsets for the data states that are not represented in the predetermined reference data pattern.

In certain embodiments, the adjustment module 506 may add the calculated offset to the read threshold such that the read thresholds better represent the charge distributions of cells in the memory cells. For example, the adjustment module 506 may change the read thresholds used by a controller to distinguish the separate data states for the cells stored in the memory array 200. Alternatively, the adjustment module 506 may apply an offset to a measured value for a cell before a controller identifies the data state associated with the measured value.

In at least one embodiment, the adjustment module 506 calculates a first offset and a second offset for the read thresholds. The adjustment module 506 calculates the first offset based on identified errors in the test pattern as described above. Further, the adjustment module 506 may calculate the second offset based on other sources of variability associated with reading data stored in the cells. For example, the adjustment module 506 calculates the second offset to compensate for read fluctuations, wherein the read fluctuations account for variability in the voltages used to read cells in the portion of the memory array 200.

In a particular embodiment, when calculating the second offset, the adjustment module 506 incrementally adds an increasingly larger offset to the first offset, where, with each increment of the second offset, the second offset changes sign. For example, in the first increment of the second offset to the first offset, the second offset may be positive. In the second increment of the second offset to the first offset, the second offset may be negative. Further, with each increment, the second offset may increase in magnitude. Also, in at least one embodiment, the first offset may be significantly larger than the second offset.

In at least one embodiment, the adjustment module 506 may calculate offsets for a single word line in a memory array 200. Alternatively, the adjustment module 506 may calculate an offset that is applied to multiple word lines in the memory array 200. Further, the adjustment module 506 may calculate an offset for a portion of a word line in the memory array 200. By calculating offsets and using the offsets to adjust the read thresholds for the memory array 200, a controller may adjust the read thresholds for the data states in the different cells of the memory array 200 as the distributions of the data states change over time in response to disturbances, such as read disturbs and data retention errors.

Figure 6:
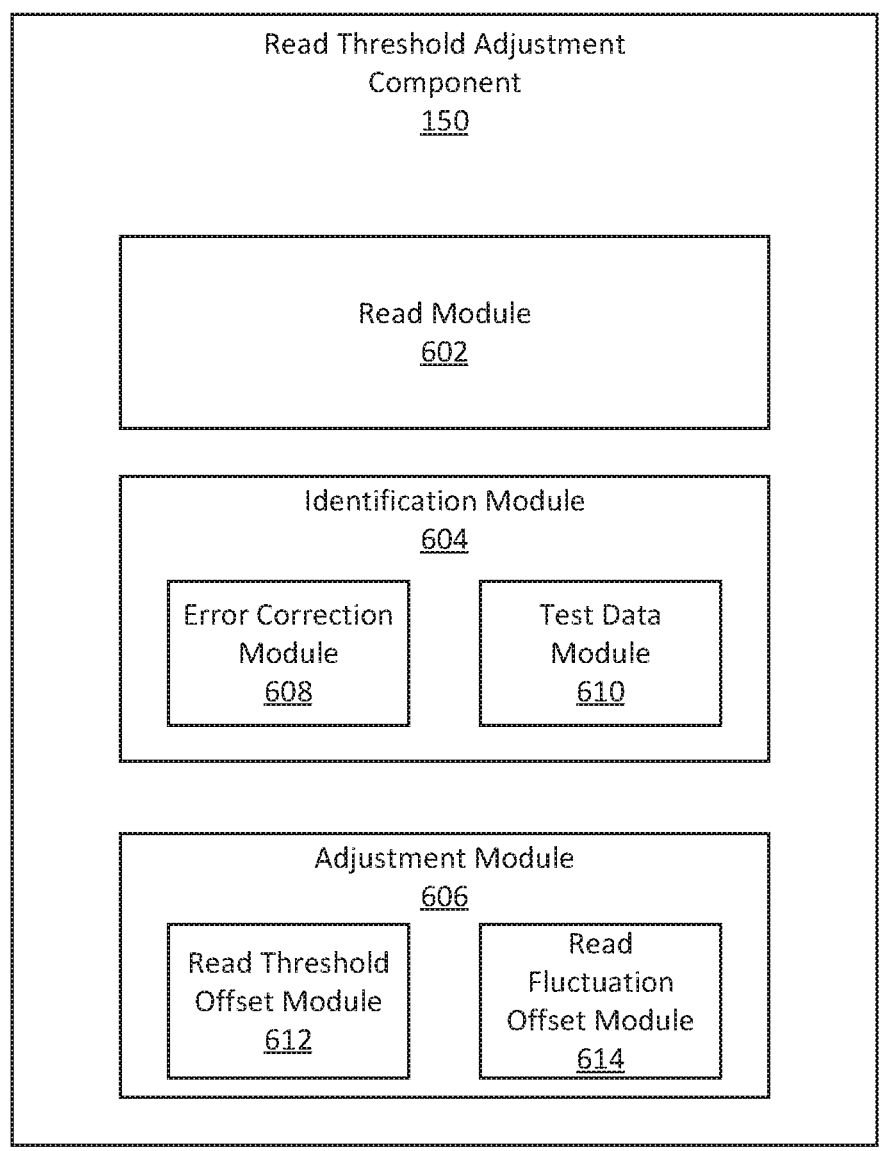
FIG. 6 is a schematic block diagram illustrating another embodiment of a read threshold adjustment component.

FIG. 6 depicts another embodiment of a read threshold adjustment component 150. The read threshold adjustment component 150, in various embodiments, may be substantially similar to the read threshold adjustment component 150 described above with respect to FIGS. 1-5. In the depicted embodiment, the read threshold adjustment component 150 includes a read module 602, on identification module 604, and an adjustment module 606, which may be configured substantially as described above with regard to FIG. 5. The identification module 604, in the depicted embodiment, includes an error correction module 608 and test data module 610. The adjustment module 606, in the depicted embodiment, includes a read threshold offset module 612 and a read fluctuation offset module 614.

In certain embodiments, before reading the test pattern stored in the memory, a controller, such as on-die controller 220, may execute error correction codes to correct errors in the memory array 200. As described above, error correction information may be stored in a word line associated with the user data. Alternatively, error correction information may be stored in association with multiple word lines, pages, or other data structure. In at least one embodiment, error correction information may include a parity bit, a Hamming code, Solomon-Reed codes, and the like. A controller may use the error correction information to determine whether there are bit errors in the associated memory. Further, the controller may use the error correction information to identify and correct errors in certain situations. For example, when the number of identified bit errors is below a threshold value for bit errors, the controller may use the error correction information to correct the bit errors. As depicted in FIG. 3, error correction information may be stored proximate to a test pattern. In at least one embodiment, error correction module 608 may be configured to determine whether identified bit errors are correctable. In further embodiments, the error correction module 608 may be configured to correct the identified errors. When the error correction module 608 is able to correct the identified errors, the error correction module 608 corrects the errors and the controller reads the user data stored in the memory. When the error correction module 608 is unable to correct the identified errors, the error correction module 608 may determine that the controller may attempt to correct the read thresholds in order to more accurately represent the data stored in the memory array 200.

In at least one embodiment, when the controller attempts to correct the read thresholds, the controller may identify the errors in a test pattern stored in a portion of the memory array 200. In certain embodiments, a test data module 610 may be configured to analyze a test pattern stored in a portion of the memory array 200. For example, the test data module 610 may analyze a test pattern stored before and proximate to user data and after proximate to the user data, where the user data is stored in a word line in the memory array 200. As described above, memory cells associated with the test pattern may alternatingly be set to the highest data state and to the erase data state. As cells in the test pattern only store the highest and erase data states, the test data module 610 may identify memory cells that are set to data states other than the highest and erase data states as errors in the test pattern. In at least one embodiment, the test data module 610 may identify the number of errors in the test pattern. Further, the test data module 610 may also identify the type of error that has occurred for each error in the test pattern. For example, the test data module 610 may determine that a memory cell originally set to the highest data state, where the memory cell is a triple-level cell, is now set to the "E" data state. Further, the test data module 610 may determine that a memory cell originally set to the erase data state is now set to the "A" data state. In short, the test data module 610 may be configured to glean information from the test pattern that may be used to characterize changes to the distribution of the data states for a portion of memory in the memory array 200.

In certain embodiments described herein, a controller may use the gathered information about the distribution of the data states to characterize the changes to the read thresholds that have occurred over the life of the memory array 200. A read threshold offset module 612 may be configured to characterize the changes to the read thresholds, calculate an offset for the read thresholds, and add the offset to the read thresholds. In at least one embodiment, the read threshold offset module 612 may calculate a separate offset for each word line in a memory array 200. Alternatively, the read threshold offset module 612 may calculate an offset for multiple word lines or other portions of memory in the memory array 200.

In at least one embodiment, the read threshold offset module 612 may calculate the offset based on the characterization of the changes identified by the test data module 610. For example, the read threshold offset module 612 may identify the offset by finding an offset in a lookup table associated with the number of changes in the test pattern. Further, the read threshold offset module 612 may also use a characterization of the types of changes in the test pattern to identify the offset in a lookup table. Alternatively, in contrast to looking up the offset in a lookup table, the read threshold offset module 612 may use the information regarding the number and type of errors to calculate an offset for the read thresholds.

In certain embodiments, the adjustment module 606 uses the calculated offset to adjust the read thresholds associated with the characterized test patterns. After adjusting the read thresholds, the identification module 604 may determine if errors exist in data stored in the memory array 200 when the read thresholds have been adjusted with the offset. For example, the error correction module 608 may determine if the data can be corrected through the use of an error correction code. If the error correction module 608 is able to correct errors in the data, the error correction module 608 corrects the errors as described above. When the error correction module 608 is not able to correct the errors in the data, the controller may incrementally add a second offset to the read thresholds. For example, the read fluctuation offset module 614 may initialize a loop counter and increment the loop counter with every addition of the second offset to the initial offset added by the read threshold offset module 612. Initially, the second offset may be iteratively calculated based on the loop counter and a base value for the second offset. For instance, the base value for the second offset may be 10 mV. When the loop counter is equal to one, a controller may calculate the second offset as being equal to −10 mV. On the next iteration of the loop, the read fluctuation offset module 614 may calculate the second offset as being equal to 15 mV. In certain embodiments, the second offset may be calculated according to the following equation: Second Offset=$-1^{count} \times$base value$\times$(count+1)/2. As shown in the equation, the base value is the base value for the second offset as described above and the count is the current iteration of the loop counter.

In at least one embodiment, the read fluctuation offset module 614 iteratively recalculates the second offset until the loop counter exceeds a loop counter threshold. For example, if the loop counter threshold is equal to six, the read fluctuation offset module 614 may recalculate the second offset six times. If the loop counter exceeds the loop counter threshold and the error correction module 608 is still unable to correct the errors in the portion of the memory array 200, then the read threshold adjustment component 150 may determine that the errors in the portion of the memory array 200 are uncorrectable. For instance, if the loop counter is equal to seven, the loop counter threshold is equal to six, and the error correction module 608 was unable to correct the errors in the portion of memory array 200, the read threshold adjustment component 150 may determine that the errors in the portion of the memory array 200 are uncorrectable. In at least one embodiment, when the errors in the portion of the memory array 200 are uncorrectable, the read threshold adjustment component 150 may indicate to the user that errors in the portion of the memory array 200 are uncorrectable.

Figure 7:
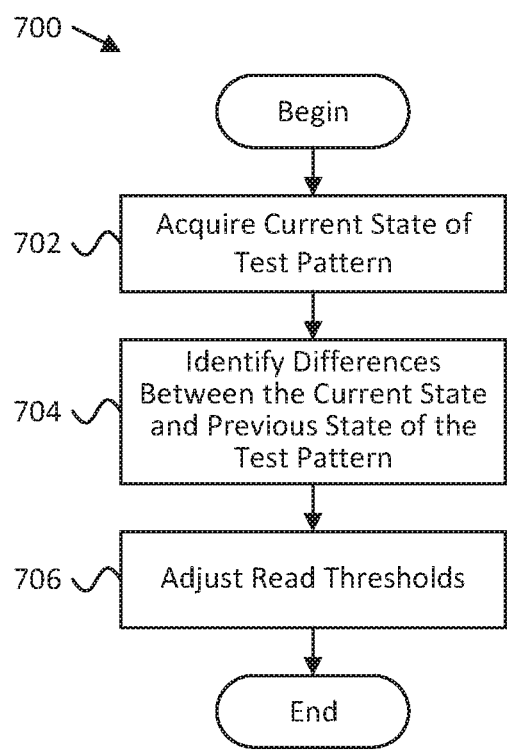
FIG. 7 is a schematic flow chart diagram illustrating one embodiment of a method for read threshold adjustment using reference data for non-volatile memory.

FIG. 7 depicts one embodiment of a method 700 for read threshold adjustment for non-volatile memory. The method 700 begins, and the read module 502 acquires 702 a current state of a test pattern. For example, the read module 502 reads data from a portion of the memory array 200 where a test pattern is stored in the memory array 200, where the current state is the state of the test pattern in the most recent read of the portion of the memory array 200 containing the test pattern. The identification module 504 identifies 704 differences between the current state and a previous state of the test pattern. For instance, the identification module 504 may compare the data read from the sub portion of memory associated with the test pattern against a known previous state for the test pattern. In certain embodiments, the previous state of the test pattern may include memory cells that alternate between a highest state and an erase state. An adjustment module 506 adjusts 706 read thresholds. For example, the adjustment module 506 adjusts read thresholds for the memory cells in the portion of the memory array 200 based on the differences between the current state and the previous state of the test pattern identified by the identification module 504.

Figure 8:
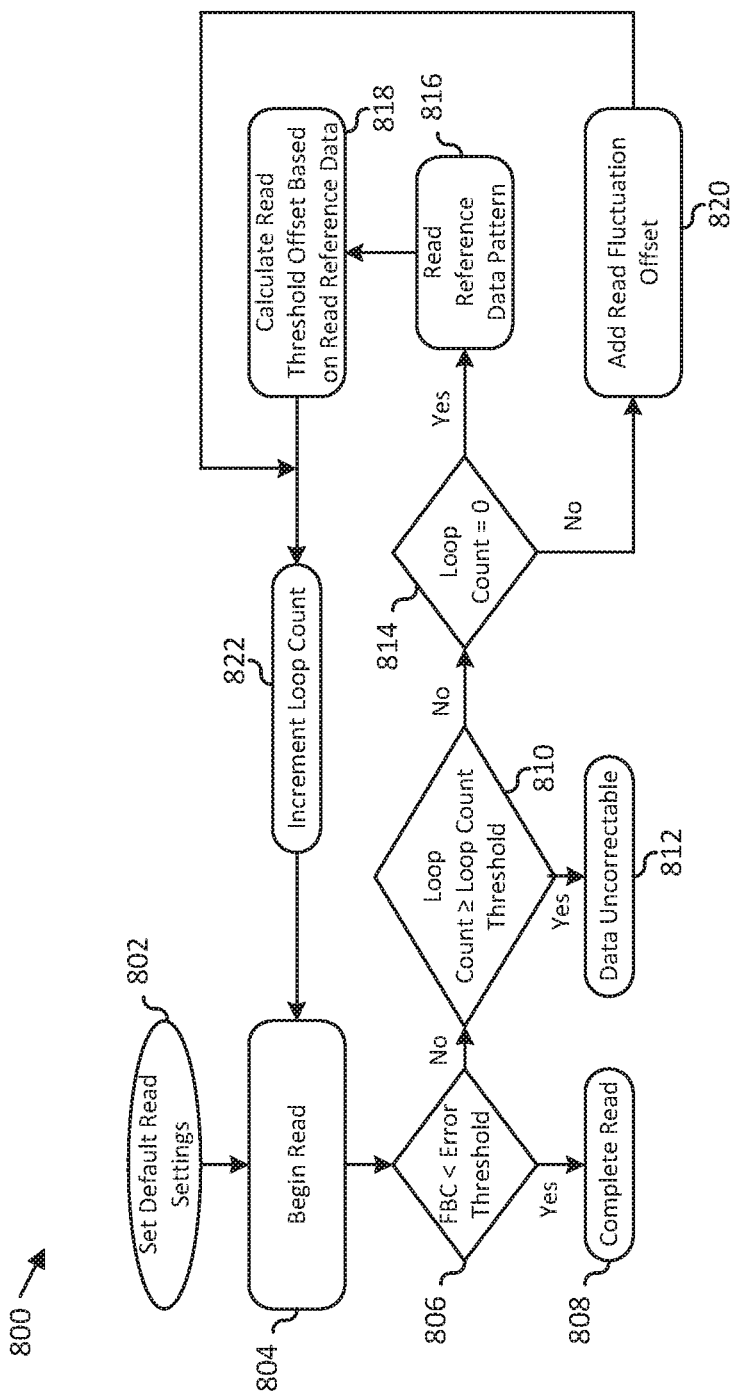
FIG. 8 is a schematic flow chart diagram illustrating another embodiment of a method for read threshold adjustment using reference data for non-volatile memory.

FIG. 8 depicts another embodiment of a method 800 for read threshold adjustment for non-volatile memory. The method 800 proceeds at 802, where default read settings are set. As described herein, the default read settings refer to read thresholds used to distinguish between different data states for a cell in the memory array 200. Further, the read settings include a loop counter, where the loop count is set to an initial default value. For example, the initial default value for the loop count may be zero. When the default read settings are set, cells in the memory array 200 may be read. The method 800 may proceed at 804, where a read begins. Further, the method 800 may proceed at 806, where a failed bit count may be compared against an error threshold, where the failed bit count is a count of bit errors in the portion of memory in the memory array 200 and the error threshold is a sentinel value that indicates whether errors in the data stored in the memory array 200 are correctable using the error correcting code. As described above, when the failed bit count is less than the error threshold, errors in the portion of the memory array being read may be corrected by an error correcting code. As such, as the errors can be corrected through the execution of the error correcting code, the controller may correct the errors in the data stored in the portion of the memory array 200. When the errors are corrected, the method 800 may proceed at 808, where the read of the data stored in the portion of the memory array 200 is completed.

In certain embodiments, when the errors in the data stored in the portion of the memory array 200 exceed the error threshold, the method 800 proceeds at 810, where a loop count is compared against a loop count threshold. As stated above with relation to the default read settings, the loop count may be initially set to zero. Further, the loop count threshold may be any number greater than or equal to the initial default read settings. For example, the loop count threshold may be equal to six. When the loop count is less than the loop count threshold, the method 800 may proceed at 814, where it is determined whether the loop count is equal to zero. When the loop count equals zero, the method 800 proceeds at 816, where the reference data pattern is read. When the reference data pattern is read, the method 800 proceeds at 818, where a read threshold offset is calculated based on the read reference data. As described above, differences between the stored reference data pattern and an expected initial reference data pattern are identified. Based on the identified differences, a controller calculates a read threshold offset and adjusts the read thresholds for the cell or cells in the memory array 200. When the read threshold offset is calculated, the method 800 proceeds at 822, where the loop count is incremented.

In at least one embodiment, with the incremented loop count, the method 800 proceeds to 804, where a read is attempted with the adjusted read thresholds. The method 800 may then proceed to 806, where it is again determined whether the failed bit count is less than the error threshold after adjusting the read thresholds. As stated above if the failed bit count is less than the error threshold than the read is completed. However, if the failed bit count is greater than the error threshold than the method 800 proceeds at 810, where it is determined whether the loop count is greater than or equal to the loop count threshold. If the loop count is greater than or equal to the loop count threshold, the method proceeds at 812, where the system determines that errors in the data stored in the portion of the memory array 200 are uncorrectable, where data is uncorrectable when error correcting codes are unable to correct bit errors in the data after adjusting the read thresholds. When the loop count is less than the loop count threshold, the method 800 proceeds again at 814, where it may be determined whether the loop count is equal to zero or some other base initial value. As the loop count has been incremented at state 822, the loop count is no longer equal to zero. Accordingly, the method 800 proceeds at 820, where a read fluctuation offset may be added in addition to the read threshold offset. As described above with respect to the second offset described in relation to FIG. 7, the read fluctuation offset may be calculated based on a base value for the read fluctuation offset and the loop count. When the read fluctuation offset is added to the read thresholds, the method proceeds at 822, where the loop count may be again incremented. As shown, the method 800 performs steps 804-822 until either the failed bit count is less than the error threshold or the loop count is greater than or equal to the loop count threshold. In certain embodiments, the method 800 may be performed with every read of data from the memory array 200. Alternatively, the method 800 may be performed periodically during the lifecycle of the memory array 200.

Figure 9:
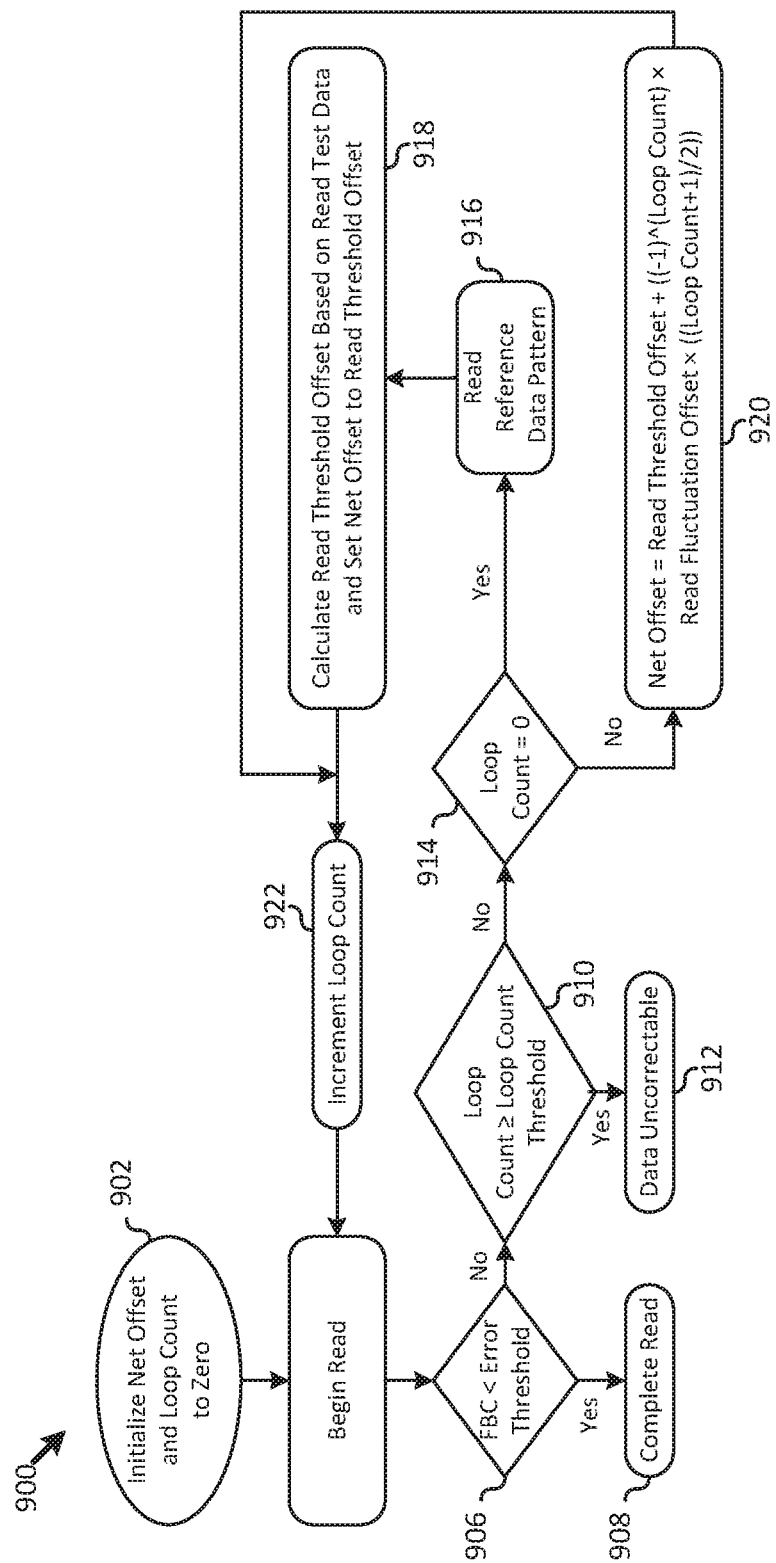
FIG. 9 is a schematic flow chart diagram illustrating another embodiment of a method for read threshold adjustment using reference data for non-volatile memory.

FIG. 9 depicts another embodiment of a method 900 for read threshold adjustment for non-volatile memory. The method 900 proceeds at 902, where a net offset and loop count are initialized to zero. When the net offset and loop count are initialized, cells in the memory array 200 may be read. The method 900 may proceed at 904, where a read begins. Further, the method 900 may proceed at 906, where a failed bit count may be compared against an error threshold, where the failed bit count is a count of bit errors in the portion of memory in the memory array 200 and the error threshold is a sentinel value that indicates whether errors in the data stored in the memory array 200 are correctable using the error correcting code. As described above, when the failed bit count is less than the error threshold, errors in the portion of the memory array being read may be corrected by an error correcting code. As such, as the errors can be corrected through the execution of the error correcting code, the controller may correct the errors in the data stored in the portion of the memory array 200. When the errors are corrected, the method 900 may proceed at 908, where the read of the data stored in the portion of the memory array 200 is completed.

In certain embodiments, when the errors in the data stored in the portion of the memory array 200 exceed the error threshold, the method 900 proceeds at 910, where a loop count is compared against a loop count threshold. As stated above with relation to the default read settings, the loop count may be initially set to zero. Further, the loop count threshold may be any number greater than or equal to the initial default read settings. For example, the loop count threshold may be equal to six. When the loop count is less than the loop count threshold, the method 900 may proceed at 914, where it is determined whether the loop count is equal to zero. When the loop count equals zero, the method 900 proceeds at 916, where the reference data pattern is read. When the reference data pattern is read, the method 900 proceeds at 918, where a read threshold offset is calculated based on the read reference data and the net offset is set to the read threshold offset. As described above, differences between the stored reference data pattern and an expected initial reference data pattern are identified. Based on the identified differences, a controller calculates a read threshold offset and adjusts the read thresholds for the cell or cells in the memory array 200. When the read threshold offset is calculated, the method 900 proceeds at 922, where the loop count is incremented.

In at least one embodiment, with the incremented loop count, the method 900 proceeds to 904, where a read is attempted with the adjusted read thresholds. The method 900 may then proceed to 906, where it is again determined whether the failed bit count is less than the error threshold after adjusting the read thresholds. As stated above if the failed bit count is less than the error threshold than the read is completed. However, if the failed bit count is greater than the error threshold than the method 900 proceeds at 910, where it is determined whether the loop count is greater than or equal to the loop count threshold. If the loop count is greater than or equal to the loop count threshold, the method proceeds at 912, where the system determines that errors in the data stored in the portion of the memory array 200 are uncorrectable, where data is uncorrectable when error correcting codes are unable to correct bit errors in the data after adjusting the read thresholds. When the loop count is less than the loop count threshold, the method 900 proceeds again at 914, where it may be determined whether the loop count is equal to zero. As the loop count has been incremented at state 922, the loop count is no longer equal to zero. Accordingly, the method 900 proceeds at 920, where a read fluctuation offset may be added in addition to the read threshold offset to the net offset. As described above with respect to the second offset described in relation to FIG. 7, the read fluctuation offset may be calculated based on a base value for the read fluctuation offset and the loop count. For example, the net offset may be calculated according to the following equation:

$$\text{Net Offset} = \text{Read Threshold Offset} + \left((-1)^{Loop\ Count} \times \text{Read Fluctuation Offset} \times \left(\frac{\text{Loop Count}+1}{2}\right)\right)$$

When the modified read fluctuation offset is added to the net offset for the read thresholds, the method proceeds at 922, where the loop count may be again incremented. As shown, the method 900 performs steps 904-922 until either the failed bit count is less than the error threshold or the loop count is greater than or equal to the loop count threshold. In certain embodiments, the method 900 may be performed with every read of data from the memory array 200. Alternatively, the method 900 may be performed periodically during the lifecycle of the memory array 200.

In various embodiments, a means for reading at least one cell of a non-volatile memory array may include a read module 502, a read threshold adjustment component 150, a state machine 222, an on-die controller 220, a device controller 126, a device driver, other logic hardware and/or other executable code stored on a computer readable storage medium. Other embodiments may include similar or equivalent means for performing a write operation.

In various embodiments, a means for identifying errors associated with two or more data states in a plurality of data states stored in the non-volatile memory array may include an identification module 504, a read threshold adjustment component 150, a state machine 222, an on-die controller 220, a device controller 126, a device driver, other logic hardware and/or other executable code stored on a computer readable storage medium. Other embodiments may include similar or equivalent means for identifying cells during the write operation.

In various embodiments, a means for adjusting read thresholds based on the identified errors may include an adjustment module 506, a read threshold adjustment component 150, a state machine 222, an on-die controller 220, a device controller 126, a device driver, other logic hardware and/or other executable code stored on a computer readable storage medium. Other embodiments may include similar or equivalent means for modifying one or more verify thresholds during the write operation.

The present disclosure may be embodied in other specific forms without departing from spirit or essential characteristics. The described embodiments to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    an array of non-volatile memory cells; and
    a controller configured to:
        write a predetermined reference data pattern together with user data to a region of the array;
        read reference data from the region;
        identify an offset for one or more read thresholds based on a predetermined correspondence between offsets and errors in the reference data, wherein the predetermined correspondence is based on a characterization of the array;
        shift the one or more read thresholds by the offset and use the one or more read thresholds shifted by the offset to read the user data.

2. The apparatus of claim 1, wherein the errors in the reference data comprise changes from bits associated with an erased state for the cells and from bits associated with a highest state for the cells.

3. The apparatus of claim 2, wherein the erased state is associated with lower page bits and the highest state is associated with upper page bits.

4. The apparatus of claim 1, wherein the predetermined reference data pattern is associated with a plurality of pages stored by cells coupled to a word line.

5. The apparatus of claim 1, wherein a size of the region storing the predetermined reference data pattern increases as the array ages.

6. The apparatus of claim 1, wherein the reference data is compared to the predetermined reference data pattern in response to a comparison by the controller of a failed bit count against an error threshold.

7. The apparatus of claim 6, wherein, in response to a comparison with the error threshold, wherein the controller determines that a failed bit count exceeds the error threshold or that there are uncorrectable errors, the controller calculates the offset for the one or more read thresholds based on the reference data.

8. The apparatus of claim 7, wherein the controller is configured to further shift the one or more read thresholds by a second offset that is smaller than the offset and compensates for read fluctuations.

9. The apparatus of claim 8, wherein the second offset is variable.

10. The apparatus of claim 8, wherein the controller recursively calculates the second offset, increments a loop count, and applies the second offset to the one or more read thresholds until the failed bit count satisfies the error threshold or the loop count exceeds a loop count threshold.

11. A method comprising:
    acquiring a current state of a test pattern in an array of non-volatile memory;
    identifying differences between the current state and a previous state for the test pattern;
    adjusting read thresholds for a portion of the array of non-volatile memory associated with the test pattern based on a predetermined correspondence between read threshold adjustments and the identified differences, wherein the predetermined correspondence is based on a characterization of the array; and
    using the adjusted read thresholds to read user data stored with the test pattern in the array.

12. The method of claim 11, wherein acquiring the current state of the test pattern comprises:
    applying an error correction code to data stored in the array of non-volatile memory; and
    acquiring the current state based on the application of the error correction code.

13. The method of claim 11, wherein adjusting read thresholds comprises shifting the read thresholds by an offset based on the test pattern.

14. The method of claim 13, wherein adjusting the read threshold comprises shifting the read thresholds by a second offset that is smaller than the offset and compensates for read fluctuations.

15. The method of claim 14, further comprising:
    recursively calculating the second offset;
    incrementing a loop count; and
    applying the second offset to the read thresholds until a failed bit count satisfies an error threshold or the loop count exceeds a loop count threshold.

16. An apparatus comprising:
    means for reading at least one cell of a non-volatile memory array;
    means for identifying errors associated with at least an erase state and a highest state of a plurality of data states; and
    means for adjusting read thresholds based on the identified errors by shifting the read threshold by an offset, the offset based on a predetermined correspondence between offsets and identified errors, wherein the predetermined correspondence is based on a characterization of the array, and the adjusted read thresholds are used to read user data.

17. The apparatus of claim 16, wherein the means for identifying errors is configured to read a test pattern stored in the at least one cell associated with the plurality of data states, wherein the errors are data states not associated with one of the erase state and the highest state.

* * * * *